(12) United States Patent
Fukuda et al.

(10) Patent No.: US 7,044,703 B2
(45) Date of Patent: May 16, 2006

(54) AUTOMATIC GUIDED VEHICLE, AUTOMATIC GUIDED VEHICLE SYSTEM AND WAFER CARRYING METHOD

(75) Inventors: Isao Fukuda, Kameoka (JP); Shuji Akiyama, Nirasaki (JP)

(73) Assignees: Murata Kikai Kabushiki Kaisha, Kyoto (JP); Tokyo Electron Limited, Tokyo (JP)

( * ) Notice: Subject to any disclaimer, the term of this patent is extended or adjusted under 35 U.S.C. 154(b) by 176 days.

(21) Appl. No.: 10/123,226

(22) Filed: Apr. 17, 2002

(65) Prior Publication Data

US 2002/0154974 A1   Oct. 24, 2002

(30) Foreign Application Priority Data

| Apr. 19, 2001 | (JP) | ............................. 2001-121021 |
| Apr. 19, 2001 | (JP) | ............................. 2001-121022 |
| Apr. 19, 2001 | (JP) | ............................. 2001-121023 |
| Apr. 19, 2001 | (JP) | ............................. 2001-121024 |

(51) Int. Cl.
*B65G 49/07* (2006.01)

(52) U.S. Cl. ........................... 414/416.03; 414/414.08; 414/936; 414/937

(58) Field of Classification Search ........... 414/416.01, 414/416.03, 413.08, 936, 937
See application file for complete search history.

(56) References Cited

U.S. PATENT DOCUMENTS

| 5,577,621 | A | * | 11/1996 | Yi ............................ 211/41.18 |
| 5,622,400 | A | * | 4/1997 | George ....................... 294/64.1 |
| 5,779,203 | A | * | 7/1998 | Edlinger ................... 248/178.1 |
| 5,944,476 | A | * | 8/1999 | Bacchi et al. ................ 414/783 |
| 5,960,959 | A | * | 10/1999 | Wu et al. .................... 206/710 |
| 5,960,960 | A | * | 10/1999 | Yamamoto ................... 206/711 |
| 6,013,112 | A | * | 1/2000 | Iizuka et al. ............... 29/25.01 |
| 6,019,563 | A | * | 2/2000 | Murata et al. ......... 414/222.01 |
| 6,021,380 | A | * | 2/2000 | Fredriksen et al. ........... 702/35 |
| 6,134,482 | A | * | 10/2000 | Iwasaki ...................... 700/121 |
| 6,157,450 | A | * | 12/2000 | Marchese-Ragona et al. .......................... 356/602 |
| 6,418,352 | B1 | * | 7/2002 | Ellis et al. .................. 700/116 |
| 6,594,560 | B1 | * | 7/2003 | Lee ............................. 701/23 |

FOREIGN PATENT DOCUMENTS

| JP | 9216180 | * | 8/1997 |
| JP | 10143244 | * | 5/1998 |
| JP | 11-121588 | * | 4/1999 |
| JP | 11-274264 |  | 10/1999 |

* cited by examiner

*Primary Examiner*—Thomas J. Brahan
(74) *Attorney, Agent, or Firm*—Westerman, Hattori, Daniels & Adrian, LLP

(57) ABSTRACT

Improvement of the workability in an automatic guided vehicle which carries and transfers a semiconductor wafer between stations in a semiconductor manufacturing plant etc.

An automatic guided vehicle 1 is moved to an objective station after storing a wafer 10 in a buffer cassette with a transfer equipment 3, the wafer 10 in a cassette 5 is transferred to a positioning device 4 by taking it up with the transfer equipment 3, an ID information of the wafer 10 is read by a OCR 43 after truing up the position and direction of the wafer 10 by the positioning device 4, the wafer 10 whose ID information is read is retained with a transfer hand 31, another wafer 10 placed on the station then is removed by the other transfer hand 31, the wafer 10 whose ID information is read is transferred to the station in the predetermined position and direction and the ID information is controlled to transmit to the station.

14 Claims, 11 Drawing Sheets

AUTOMATIC GUIDED VEHICLE, AUTOMATIC GUIDED VEHICLE SYSTEM AND WAFER CARRYING METHOD

FIELD OF THE INVENTION

The art is known from the past, that an automatic guided vehicle is traveled automatically is a semiconductor manufacturing plant wherein the dust generation becomes a problem for transferring and carrying a semiconductor wafer.

This automatic guided vehicle is equipped with a robot arm for transferring the wafer itself, a robot arm for transferring a cassette for storing the wafer, a positioning device for truing up the position and direction of the wafer and a reading unit for reading ID information such as a wafer manufacturing record etc., and the positioning device is disposed in the center of the automatic guided vehicle wherein the place for the cassette is reserved in the front or back end of the automatic guided vehicle and the respective robot arms is disposed in the other end.

First, the automatic guided vehicle places the cassette in a place position after receiving it from a given automated warehouse etc. with the robot arm for transferring the cassette, sets the wafer in the positioning device after picking it up from the cassette with the robot arm for transferring the wafer and inserts the wafer into the cassette again after heading the part of the wafer ID information for the constant place. Consequently, the whole wafers in the cassette are trued up for heading the part of the wafer ID information for the same direction.

However, wafers are transferred to a processor such as an inspecting unit by the cassette storing the wafers in the conventional automatic guided vehicle, so that the means for transferring the wafers must be provided in every inspecting unit.

As the wafers must be inspected by picking them up one by one from the cassette with the wafer transfer means on the inspecting unit side since the wafers are transferred to each examination device by the cassette even if a plurality of the inspecting units is provided side by side along the track of the automatic guided vehicle, every cassette needed to be waiting for finishing the inspection of the whole wafers in the cassette even if the inspected wafer is wanted immediately.

Further, if the inspected wafer is urgently prepared, the following inspection process is implemented such that the wafers in the cassette are refilled in a refill station, only one wafer is stored in each cassette, a plurality of the cassettes which include only one wafer is prepared and the cassette is carried to each inspecting unit in order by reciprocating the automatic guided vehicle as it takes time in the above method, but even this method can limit performance.

It is an object of the present invention to improve carrying efficiency of wafers by an automatic guided vehicle and to provide the automatic guided vehicle and the carrying method of the wafer in view of these problems.

SUMMARY OF THE INVENTION

The problem to be solved of the present invention is described above, and the means for solving the problem will be described next.

More specifically, the cassette is set up so as to take the wafer in and out in a horizontal state when transferring the wafer to the cassette with the transfer means, and the cassette is set up so as to prevent the wafer in the cassette from jumping out when traveling the automatic guided vehicle, in the automatic guided vehicle equipped with the transfer means for loading the wafers and the fixed type cassette for storing the wafer temporarily.

Moreover, the wafer in the cassette is prevented from jumping out by tilting the cassette on the automatic guided vehicle.

Further, the cassette is composed so as to tilt by providing the rotation fulcrum on the near side of the back face of the cassette, and the position of the cassette is fixed in the state that the wafer in the cassette is horizontal or the wafer in the cassette moves to the back side (the back face side) of the cassette. Furthermore, the automatic guided vehicle which carries semiconductor wafers automatically is equipped with the positioning means for truing up the position and direction of wafers, the transfer means for transferring the wafer and the reading unit for reading ID information, and a retention means for preventing the displacement of the wafer is laid in the transfer means. Moreover, the retention means is regarded as a suction means for acting on the face of the wafer.

In addition, the automatic guided vehicle which carries semiconductor wafers automatically is equipped with the transfer means for transferring the wafer, the positioning means for truing up the position and direction of wafers and the cassette for storing a plurality of wafers, and the transfer means is disposed in the center of the automatic guided vehicle and the positioning means and the cassette are disposed in the vicinity of the transfer means. Moreover, the means for transferring the wafer is composed of a pair of the transfer means.

Further, each one of the pair of the transfer means is moved independently.

Furthermore, multiple sizes of wafers are stored in the cassette.

Further, the system for transferring the wafer to the station by the automatic guided vehicle equipped with the transfer means for transferring the wafer, the cassette for storing the wafer which is fixed in the vehicle body, the positioning means for truing up the position and direction of wafers and the reading means for reading the wafer ID information arranges the control means such that the wafer whose ID information is read with the reading means is retained by the transfer means after the position and direction of wafers is trued up with the positioning means by picking up and transferring the wafer in the cassette with the transfer means after the automatic guided vehicle is traveled for and stopped at the objective station by storing the wafer in the cassette with the transfer means, and another wafer is removed by the other transfer means if it is placed in the station and the wafer whose ID information is read is transferred to the station in the predetermined position and direction and the control means is provided for transmitting ID information to the station.

Moreover, the station is installed in the processor of the wafer and the station is provided with a situation recognition means for recognizing the situation of the processor.

Further, multiple sizes of wafers are stored in the cassette.

Furthermore, the station is disposed on the both sides of the traveling route of the automatic guided vehicle.

Additionally, multiple sizes of wafer are stored in the cassette, the station is installed in the processor of the wafer disposed on the both sides of the traveling route of the automatic guided vehicle and is equipped with the automatic guided vehicle controller for controlling the automatic guided vehicle and recognizes the size of the wafer transferred by the automatic guided vehicle and the transfer direction of the transfer equipment based on the information transmitted from an automatic guided vehicle controller.

In a wafer carrying method using the system of carrying the wafer to the station by the automatic guided vehicle equipped with the transfer means for transferring the wafer, the cassette for storing the wafer which is fixed in the vehicle body, the positioning means for truing up the position and direction of wafers and the reading means for reading the wafer ID information, the wafer whose ID information is read is retained with the transfer means after the position and direction of wafers is trued up with the positioning means by picking up the wafer in the cassette and transferring to the positioning means after the automatic guided vehicle is traveled for and stopped at the objective station after storing the wafer in the cassette with the transfer means, and another wafer is removed by the other transfer means if it is placed in the station and the wafer whose ID information is read is transferred to the station in the predetermined position and direction and the ID information is transmitted to the station.

DETAILED DESCRIPTION OF THE PREFERRED EMBODIMENT

Next, a preferred embodiment of the present invention will be described with reference to the drawings.

First, a total structure of an automatic guided vehicle 1 will be described. In the following description, the right, left and lateral position of each structure will be described, regarding an arrow direction F in FIG. 1 as the front. Moreover, the right, left and lateral position of each structure in the other drawings is also based on FIG. 1.

Figure 1:
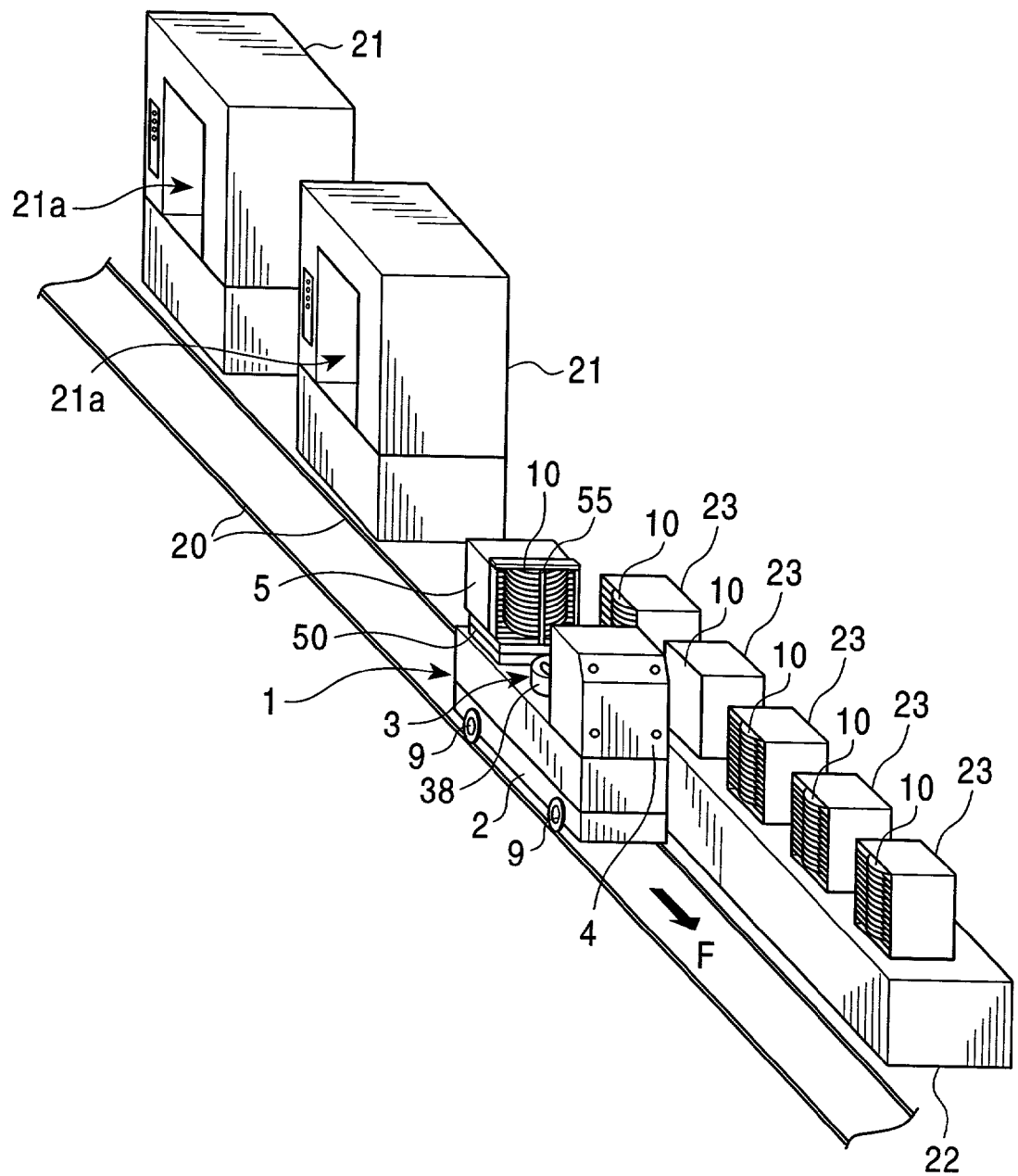
FIG. 1 is a perspective view illustrating an appearance of an automatic guided vehicle in a clean room.
Figure 2:
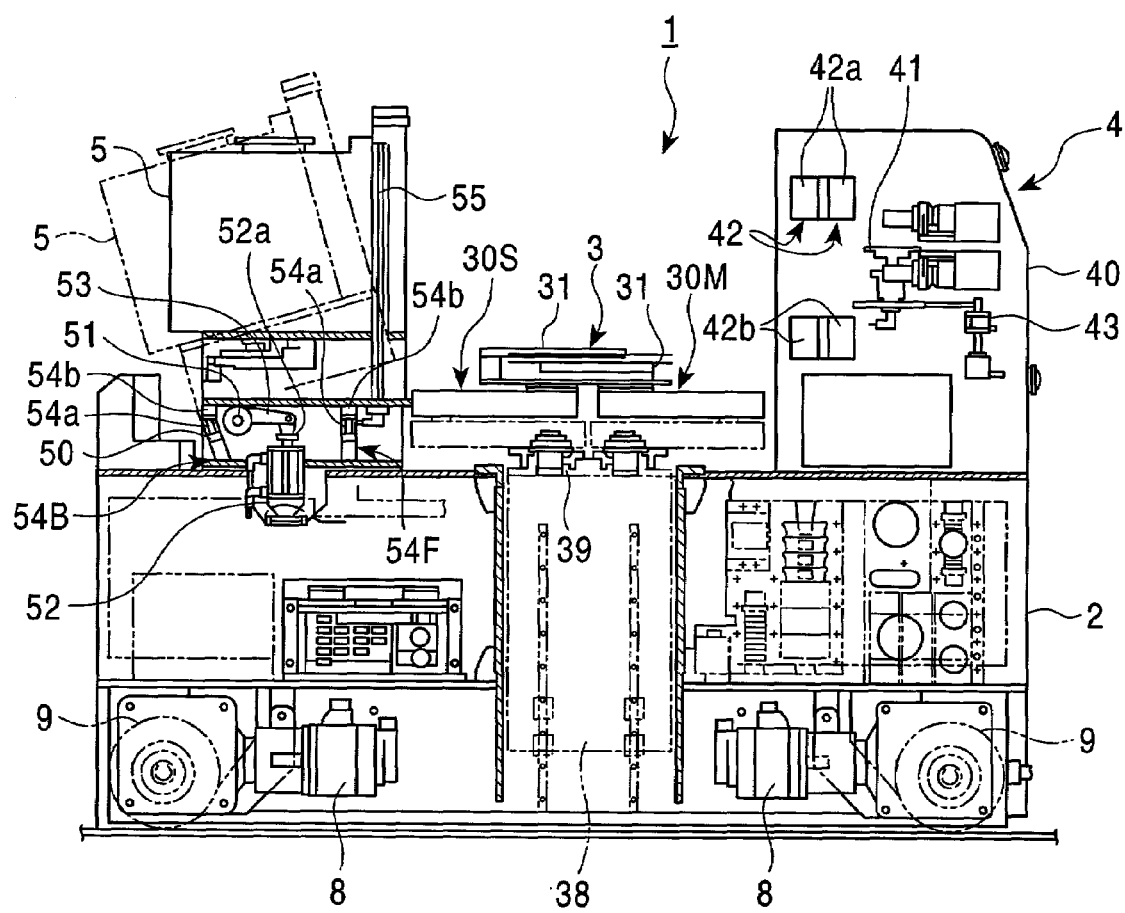
FIG. 2 is a sectional side view of the automatic guided vehicle.

As described in FIG. 1, the automatic guided vehicle 1 that is a track guided vehicle traveling on traveling rails 20, 20 automatically is traveled with four wheel drive by that a vehicle body 2 is supported by traveling wheels 9, 9, 9, 9 which are driven by respective drive motors 8, 8, 8, 8 (FIG. 2).

In addition, the respective motors 8, 8, 8, 8 is installed in the traveling wheels 9, 9, 9, 9 respectively for transmitting the drive to the whole traveling wheels 9, 9, 9, 9 in order to reduce the skid, however the mechanism for transmitting the drive to the whole traveling wheels 9, 9, 9, 9 is not confined to this and other mechanism is also available. Moreover, the number of the drive wheel is not limited to four if the wheels are provided in the back and forth of the vehicle body respectively.

Processors 21, 21 and a stocker 22 are disposed along the traveling rails 20, 20 and a plurality of cassettes 23, 23 is arranged side by side in a line at predetermined intervals on the stocker 22. The respective cassettes 23, 23 is disposed by heading the opening for the traveling rails 20, 20 side and multiple shelves for retaining the side end of a wafer 10 are provided in the back and forth internal surfaces of the cassette 23, so that the wafers 10, 10 are stored horizontally in the cassette 23.

A flat type stocker is used as the stocker 22 for facilitating the explanation in the preferred embodiment of the present invention, however an automated warehouse equipped with the entrance and exit of the cassette 23, multiple shelves and a stacker crane for transferring the cassette 23 is also available.

Figure 3:
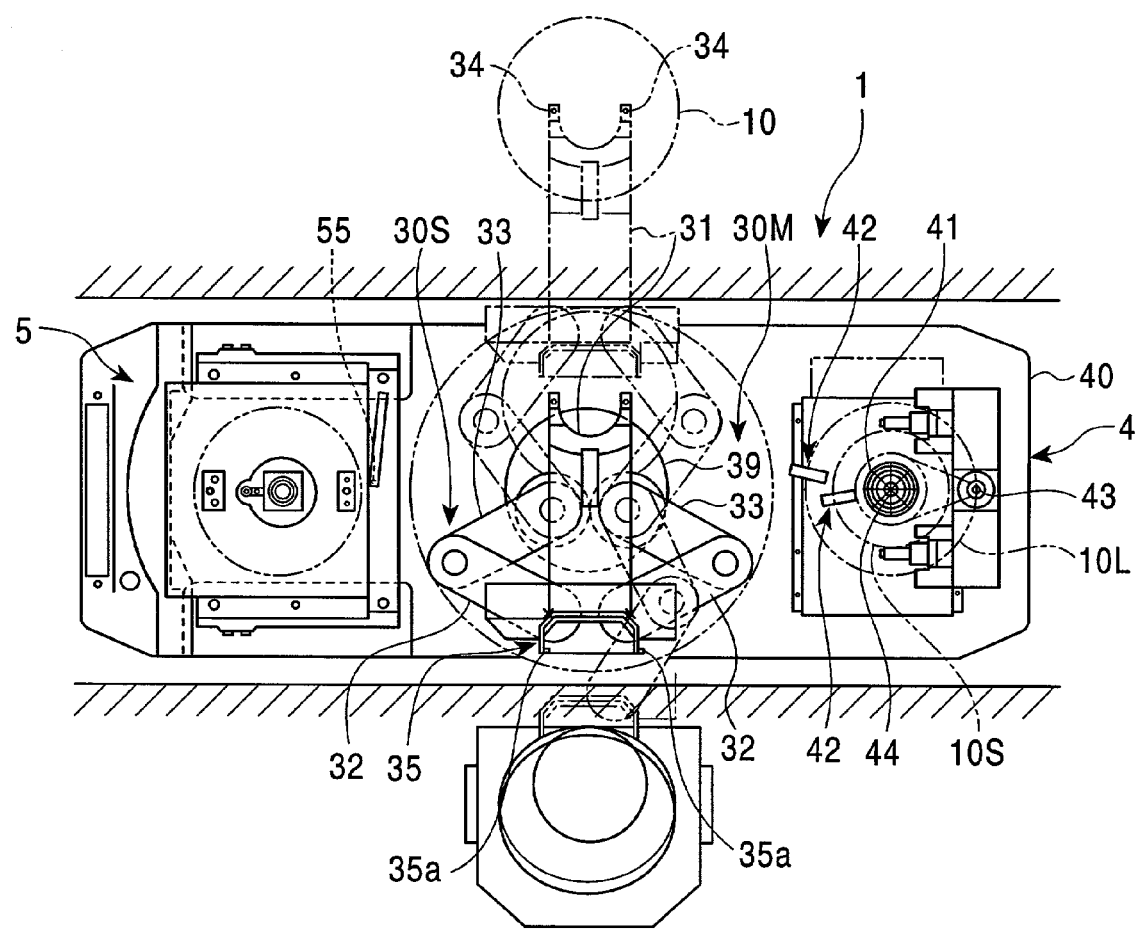
FIG. 3 is a plan view of the automatic guided vehicle.

As illustrated in FIG. 2 and FIG. 3, a transfer equipment 3 for transferring the wafers 10, 10 is disposed in the center of the vehicle body 2 of the automatic guided vehicle 1, and a positioning device 4 for truing up the direction of the wafers 10, 10 . . . and the central position and a buffer cassette 5 for storing the wafers 10, 10 are disposed in the vicinity of the transfer equipment 3.

Figure 4A:
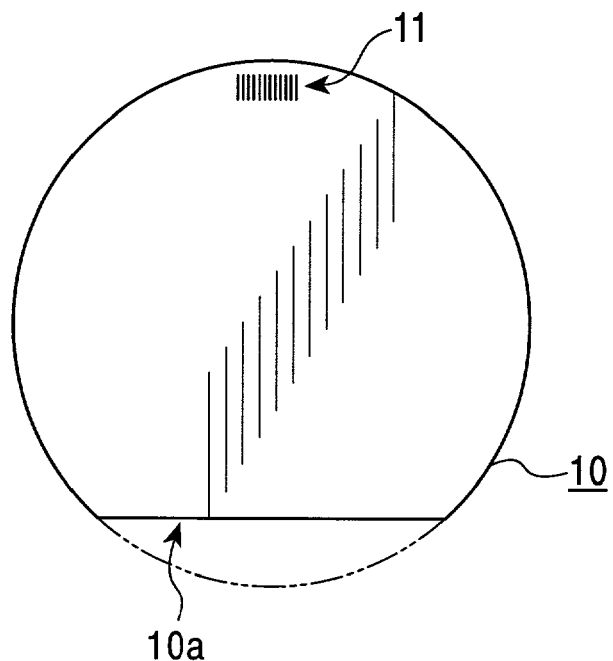
FIG. 4A is a plan view of a wafer having an orientation flat.

Some of the wafer 10, that is almost disc-shaped and comprised of the silicon single crystal which has a sense of direction, has a straight line part that is an orientation flat 10a formed in a part of the periphery of the wafer 10 as illustrated in FIG. 4A and others has a notch 10b notching a part of the periphery of the wafer 10. An ID mark 11 encoding the wafer information such as the manufacturing record of the wafer is marked in the peripheral part of the face or backside of each wafer.

Next, the transfer equipment 3 will be described.

As illustrated in FIG. 2 and FIG. 3, the transfer equipment 3 is comprised of transfer arms 30M, 30S, a base 38 and turntables 39, 39 etc., and the base 38 is buried in the center of the vehicle body 2, the turntable 39 is installed rotatably on the base 38 and a pair of the transfer arms 30M, 30S is installed on the turntable 39.

Figure 5:
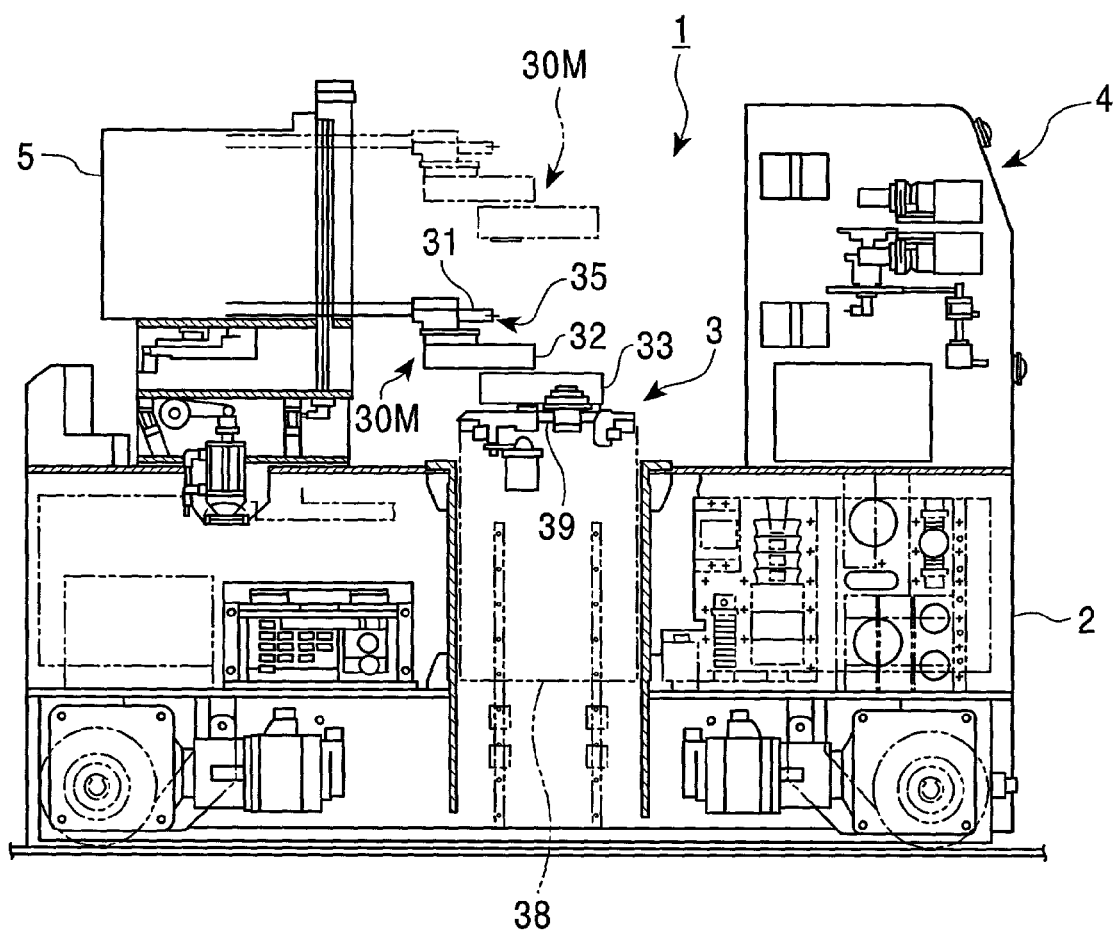
FIG. 5 is a sectional side view of the automatic guided vehicle in raising a base.

As illustrated in FIG. 5, the base 38 is composed elevatably and an elevating mechanism 61 (FIG. 7) is provided that a nut runner installed in the bottom of the base 38 fixedly is embedded in a threaded rod installed on the base 38 side in a standing manner and the upper part of the base 38 is projected from the upper surface of the vehicle body 2 by rotating the rod with the electric motor and moving the nut runner up and down.

Figure 6A:
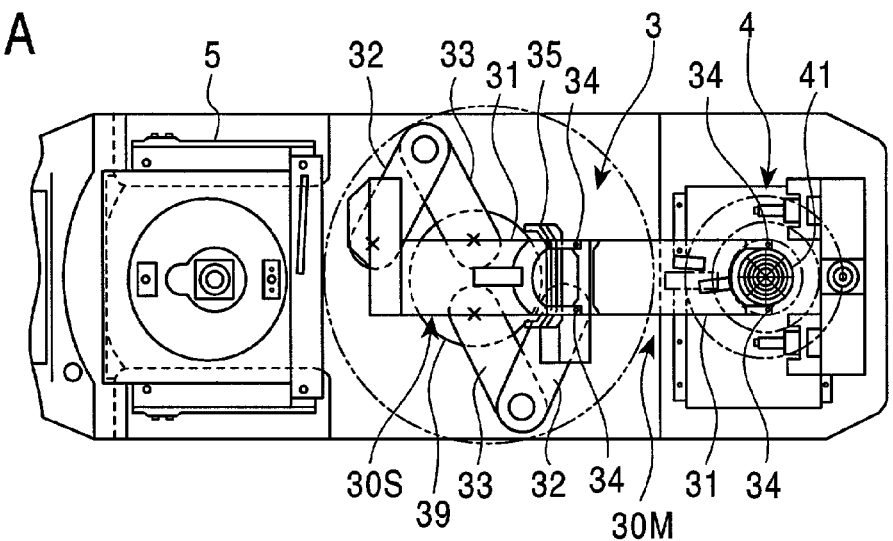
FIG. 6A is a plan view of the automatic guided vehicle when the wafer is transferred to a positioning device.
Figure 6B:
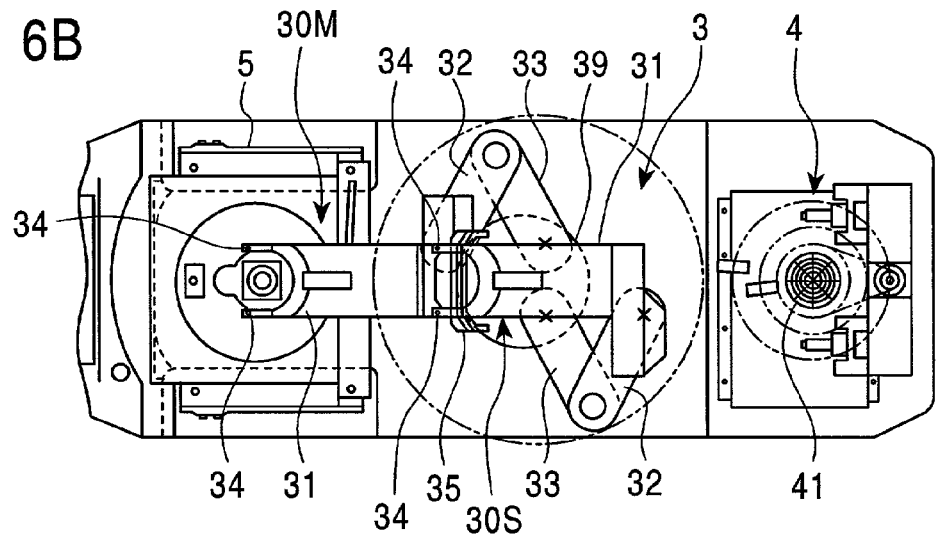
FIG. 6B is a plan view of the automatic guided vehicle when the wafer is transferred to a buffer cassette.
Figure 6C:
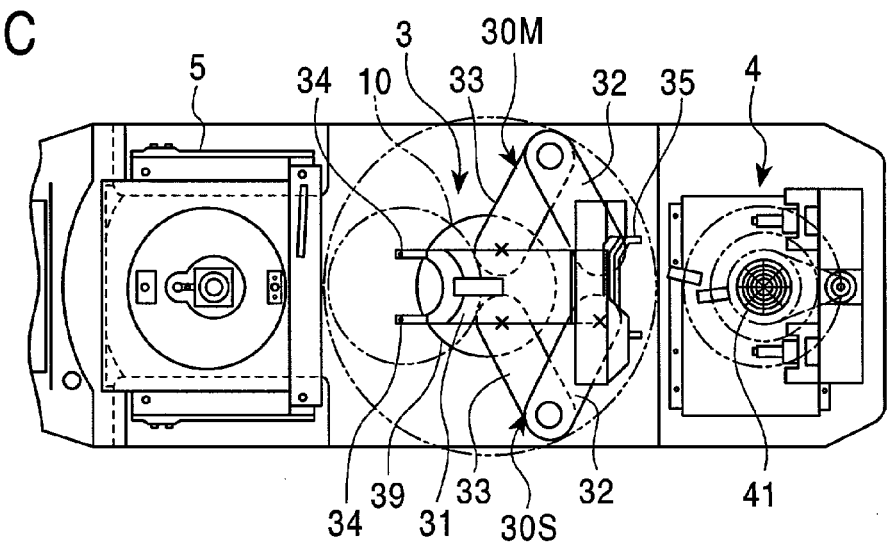
FIG. 6C is a plan view of the automatic guided vehicle when the wafer is picked up from the buffer cassette.

Moreover, as illustrated in FIG. 6, the turntable 39 can be rotated to the base 38 as an electric motor 62 (FIG. 7) is buried in the base 38 which rotates the rotating shaft of the turntable 39.

The transfer arm 30M (30S) that is a scalar arm type robot hand embedded the link mechanism by a transfer hand 31, a first arm 32 and a second arm 33 is composed bendably by an actuator 63 (FIG. 7) comprising the servomotor etc.

Figure 7:
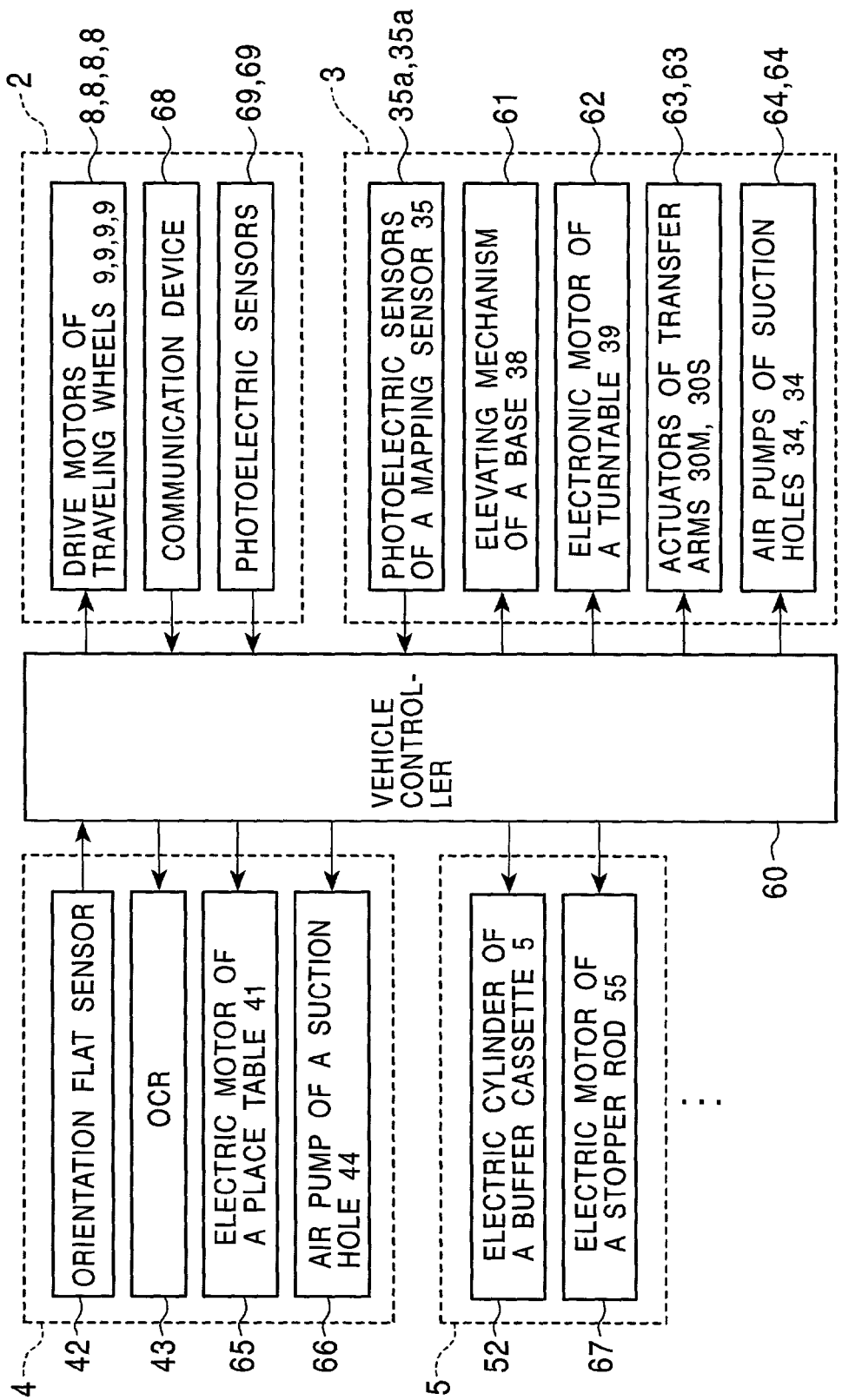
FIG. 7 is a block diagram illustrating the control structure of the automatic guided vehicle.

The transfer hand 31, formed by the almost concave plate seen from the top and provided suction holes 34, 34 in the bifurcate tip part of the transfer hand 31, can suck and retain the wafer 10 by sucking with an air pump 64 (FIG. 7).

Moreover, a mapping sensor 35 is installed in the end part of the other transfer arm 30M on the opposite side of the suction holes 34, 34 in the transfer hand 31. Hereinafter, this transfer arm 30M is called "master" and the other transfer arm 30S is called "slave".

The mapping sensor 35, whose tip is bifurcate and formed V shape seen from the top and becomes photoelectric sensors 35a, 35a, comes close to the buffer cassette 5 by raising the base 38 and bending and stretching the transfer arm 30M, so that the presence of the wafers 10, 10 . . . is detected by moving the base 38 downward and scanning each shelf of the buffer cassette 5 with the photoelectric sensors 35a, 35a.

FIG. 7 is a block diagram illustrating the control structure of the automatic guided vehicle 1, and the drive motors 8, 8, 8, 8 for driving the respective traveling wheels 9, 9, 9, 9 of the automatic guided vehicle 1 independently, the elevating mechanism 61 for elevating the base 38, the electric motor 62 for rotating the turntable 39, the actuators 63, 63 for bending and stretching the transfer arms 30M, 30S, the air pump 64 for sucking the wafer 10 with the suction holes 34, 34 and the photoelectric sensors 35a, 35a of the mapping sensor 35 are connected to a vehicle controller 60 built in the vehicle body 2 and it is operated in the predetermined procedure.

Next, the positioning device 4 will be described.

Figure 4B:
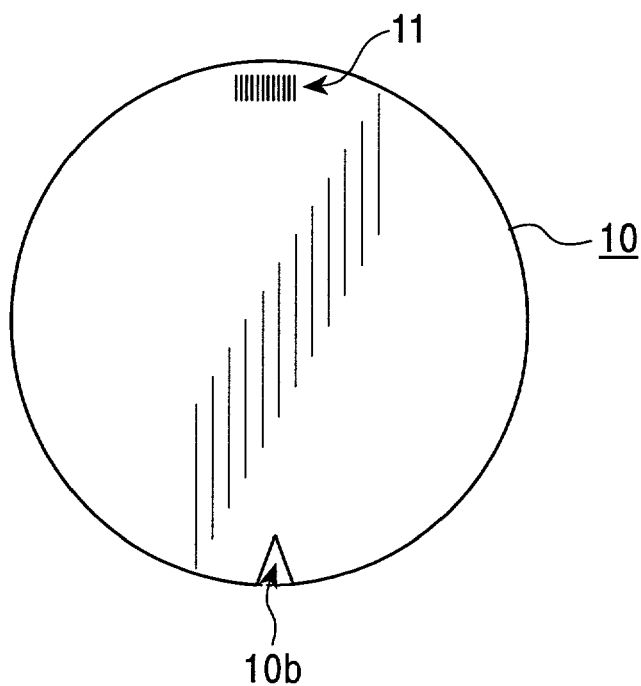
FIG. 4B is a plan view of a wafer having a notch.

As illustrated in FIG. 3 and FIG. 4, the positioning device 4 comprises a casing 40, a place table 41, orientation flat sensors 42, 42 and an optical character reader (OCR) 43 etc., and two pairs of the orientation flat sensors 42, 42 are disposed in the vicinity of the inlet of the casing 40 by opening the transfer equipment 3 side and a projector 42a are buried in the ceiling surface and a light sensor 42b is buried in the floor surface respectively. This two pairs of orientation flat sensors 42, 42 are composed such that the outside (the opening inlet side of the casing 4) orientation flat sensor 42 detects the orientation flat 10a position (or the notch 10b position) of a 12-inch wafer 10L and the inside (the back side of the opening of the casing 4) orientation flat sensor 42 detects the orientation flat 10a position (or the notch 10b position) of a 12-inch wafer 10S.

Moreover, the wafer 10 is set by facing the face with the ID mark 11 down in the casing 40 buried the OCR 43 on the backside of the floor surface of the opening of the casing 40 and the ID mark 11 is read by the OCR 43. Additionally, the wafer 10 can be set by facing the surface with the ID mark 11 up. In this case, the OCR 43 can be disposed on the back side of the ceiling surface of the opening of the casing 40, or a pair of up and down OCRs 43, 43 can be disposed on the back side of the ceiling and floor surface of the opening of the casing 40 on ground that the face of the wafer 10 is changed up and down in the operational process.

Further, the place table 41 for placing the wafer 10 is provided on the floor surface of the opening of the casing 40. A suction hole 44 is provided in the rotation shaft of the disc-shaped place table 41, and the suction groove is formed concentrically from the suction hole 44, and the suction hole 44 and the suction groove suck and retain the wafer 10 by sucking with an air pump 66 (FIG. 7), so that the wafer 10 is arranged not to blow off from the place table 41 by centrifugal force when rotating the place table 41 with an electric motor 65 (FIG. 7).

The electric motor 65 for rotating this place table 41, the air pump 66 for sucking the wafer 10 with the suction hole 44, the orientation flat sensors 42, 42 and the OCR 43 are operated by the control signal from the vehicle controller 60 by connecting to the vehicle controller 60 as illustrated in FIG. 7.

Next, the buffer cassette 5 will be described.

As illustrated in FIG. 1, the buffer cassette 5 is disposed on a buffer table 50 by facing the opening forward (the transfer equipment 3 side). Multiple shelves for retaining the end side of the wafer 10 are provided up and down respectively on the right and left side surfaces in the buffer cassette 5, and the wafers 10, 10 . . . are stored vertically in the buffer cassette 5.

As illustrated in FIG. 2, a rotating fulcrum shaft 51 is installed horizontally in the back part of the lower surface of the buffer cassette 5 and is rotatably supported in the back part of the buffer table 50. Moreover, an electric cylinder 52 is buried in the vicinity of the center of the place surface of the buffer table 50 and the upper end of a cylinder rod 52a of the electric cylinder 52 is connected to the rotating fulcrum shaft 51 through an arm 53.

The buffer cassette 5 is tilted back and forth by expanding and contracting the cylinder rod 52a like this and rotating the rotating fulcrum shaft 51. Moreover, stopper mechanisms 54F, 54B are provided in the forward and backward positions of the side of the buffer cassette 5, and it is stopped in the position that the shelf placing the wafers 10, 10 . . . becomes flat (the horizontal state) or the position that the shelf is leaned to the upper part of the front (the leaning state).

The stopper mechanisms 54F, 54B, comprising stopper pins 54a, 54a provided in the side of the buffer table 50 respectively and tube bodies 54b, 54b dropping vertically from the buffer cassette 5 side, fix the position of the buffer cassette 5 by making the stopper pin 54a abut on the tube body 54b.

This forward stopper pin 54a is installed in a standing manner by turning it up vertically and the backward stopper pin 54a is installed in a standing manner by turning it up to the back, and the position is fixed by making the stopper pin 54a of the forward stopper mechanism 54F abut on the tube body 54b when the buffer cassette 5 is horizontal and by making the stopper pin 54a of the backward stopper mechanism 54B abut on the tube body 54b when the buffer cassette 5 is leaned.

Moreover, the rubber cushion etc. is buried in the tube bodies 54b, 54b, so that the wafers 10, 10 in the buffer cassette 5 are prevented from rotating and displacing by absorbing the shock when making the stopper pin 54a abut on the tube body 54b.

Due to the structure like this, the wafers 10, 10 . . . is prevented from coming out from the buffer cassette 5 while traveling by making it leaned when traveling the automatic guided vehicle 1.

Further, as illustrated in FIG. 1 and FIG. 3, the upper and lower ends of a stopper rod 55 are engaged with a groove part as the stopper rod 55 is provided in the vicinity of the opening of the buffer cassette 5 and the groove part is formed from the left end position to the central position of the upper and lower frames surrounding the opening. An elastic body is provided in the stopper rod 55 for example, so that the wafer 10 can be pressed and retained.

The stopper rod 55, generally located in the left end part of the buffer cassette 5, makes the buffer cassette 5 lean, slide to the central part of the buffer cassette 5 by winding the wire with an electric motor 67 (FIG. 7) when traveling the automatic guided vehicle 1 and press to the wafer 10, so that the wafers 10, 10 . . . are prevented from coming out from the buffer cassette 5 even if the automatic guided vehicle 1 lays rubber or stops suddenly etc.

Consequently, as illustrated in FIG. 7, the electric cylinder 52 for tilting the buffer cassette 5 and the electric motor 67 for sliding the stopper rod 55 are connected to the vehicle controller 60 and they are operated by the control signal from the vehicle controller 60.

Further, photoelectric sensors 69, 69 provided in the vehicle body 2 of the automatic guided vehicle 1 are connected to the vehicle controller 60. Meanwhile, as a stop position marker is provided in the predetermined opposite position of the processors 21, 21 . . . of the traveling rails 20, 20 and the stoker 22, it is composed such that the automatic guided vehicle 1 is stopped at the objective position by outputting the stop instruction from the vehicle controller 60 to the drive motors 8, 8, 8, 8 of the whole traveling wheels 9, 9, 9, 9 when the automatic guided vehicle 1 which travels automatically detects the objective stop position marker with the photoelectric sensor 69.

Figure 8:
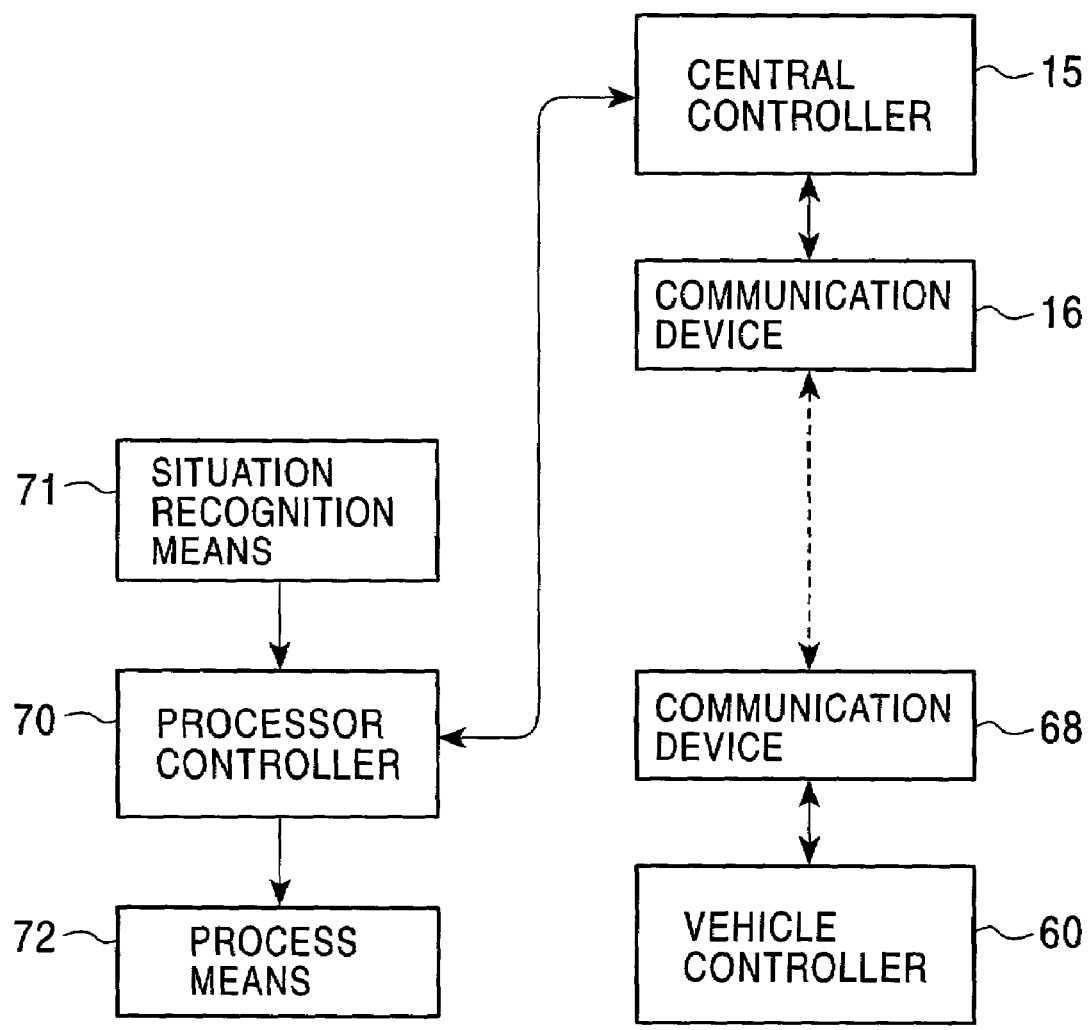
FIG. 8 is a block diagram illustrating the control structure of the automatic guided vehicle system.

Thus, the movement of the automatic guided vehicle 1 is controlled by the vehicle controller 60. Further, a communication device 68 is annexed to the vehicle controller 60, and the communication device 68 communicates with a communication device 16 of a central controller 15 as illustrated in FIG. 8 and transmits the carrier instruction etc. to the automatic guided vehicle 1. The automatic guided vehicle 1 carries the wafer 10 to the objective processor 21 and the stocker 22 by the vehicle controller 60 based on the carrier instruction.

Moreover, the central controller 15 is connected to a processor controller 70 for controlling the processor 21 through the control line. A situation recognition means 71 for recognizing the process situation of the processor 21 and a process means 72 for implementing the inspection process based on the ID information of the wafer 10 etc. are annexed to this processor controller 70.

Before completing the process that the situation recognition means 71 recognizes the present situation of the processing wafer 10, the signal is transmitted from the processor controller 70 to the vehicle controller 60 through the communication device 16 of the central controller 15 and the transferability of the next wafer 10 is informed to the processor 21.

Figure 9:
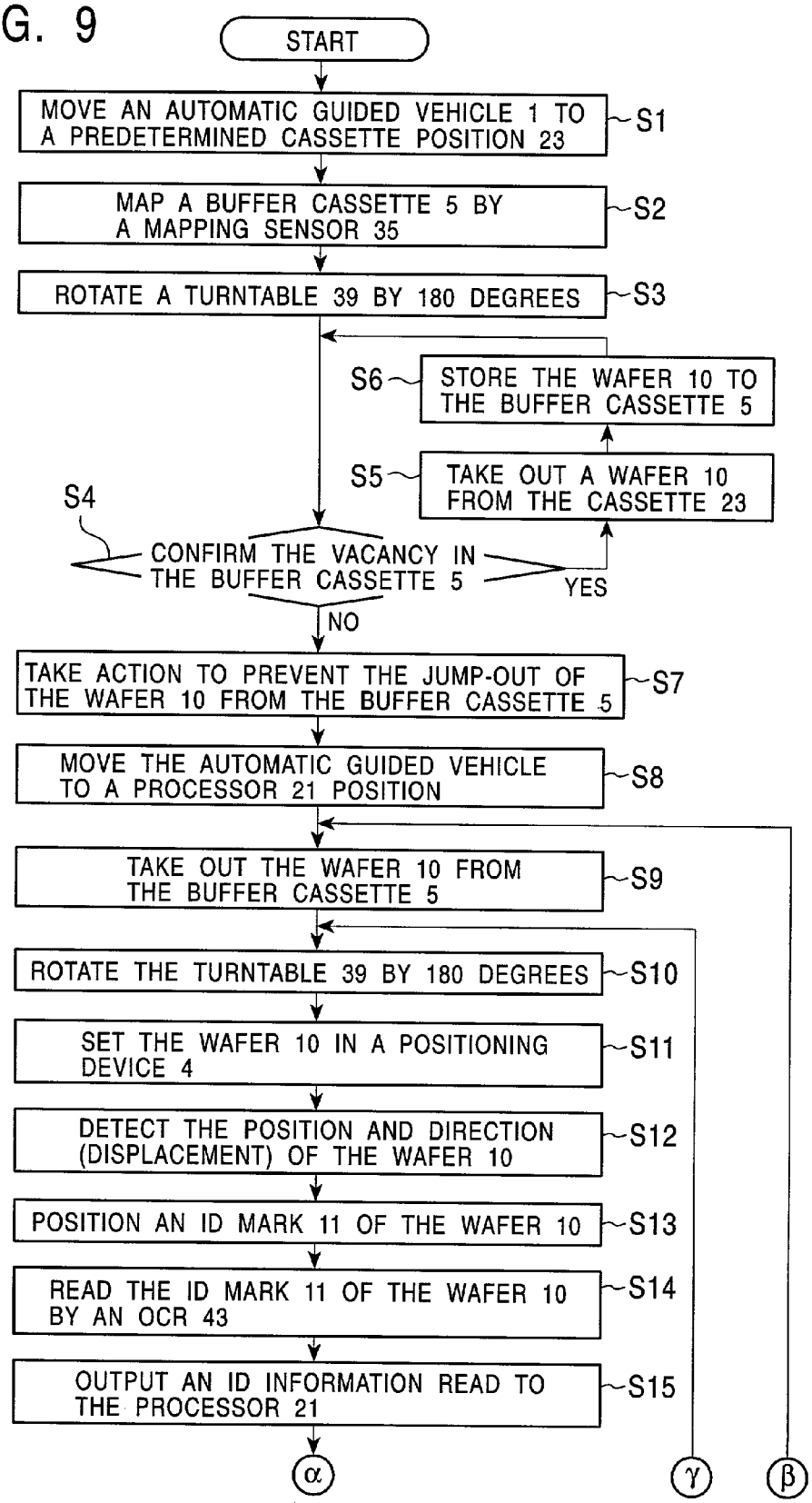
FIG. 9 is a flow chart illustrating a first half of a transfer process of the wafer by the automatic guided vehicle.
Figure 10:
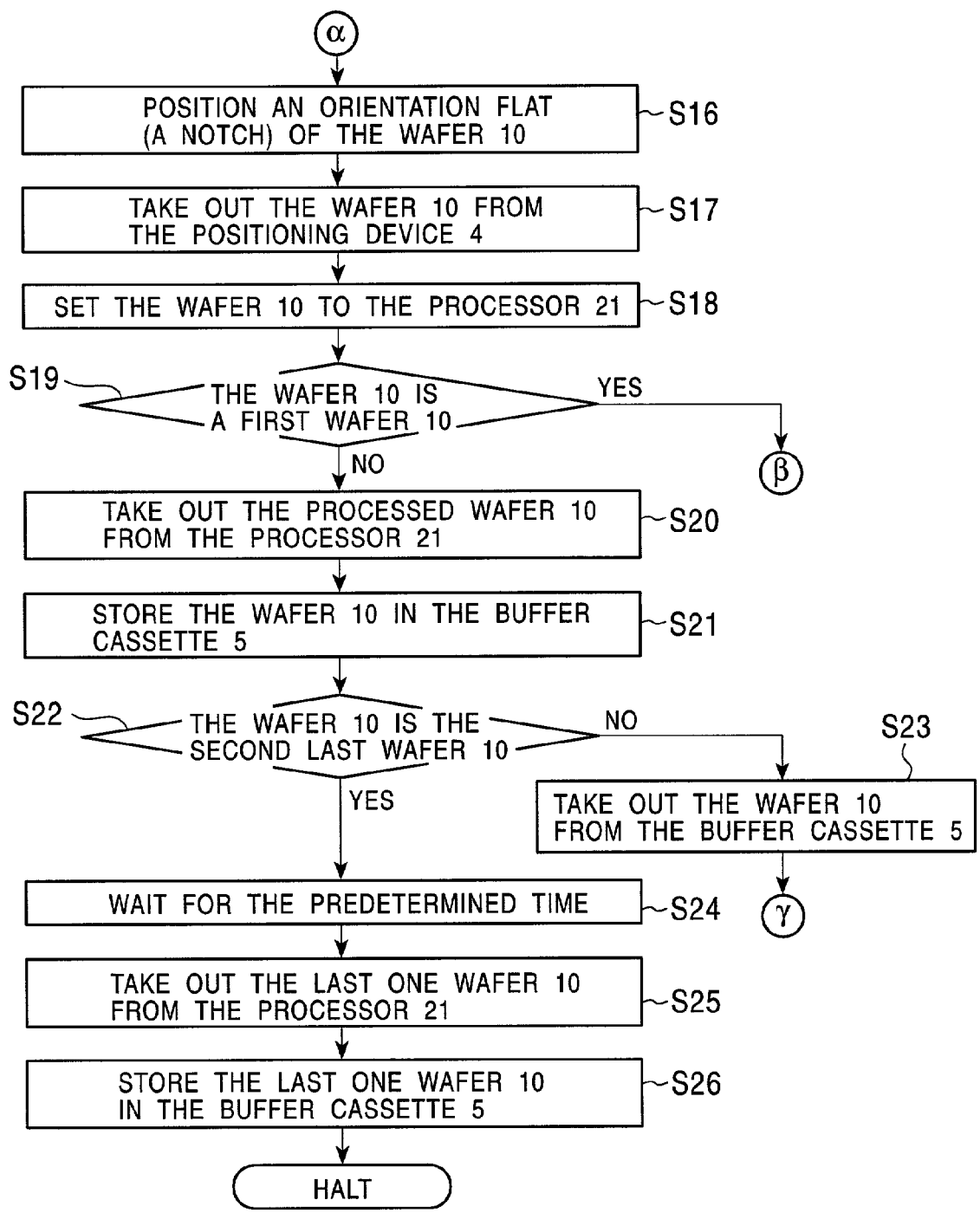
FIG. 10 is a flow chart illustrating a last half of a transfer process of the wafer by the automatic guided vehicle.

Next, a series of the movement that the wafers 10, 10 . . . are transferred by the automatic guided vehicle 1 will be described with reference to the flow chart as illustrated in FIG. 9 and FIG. 10.

As illustrated in FIG. 9, the automatic guided vehicle 1 is moved to the predetermined cassette 23 position on the stocker 22 by the automatic traveling control (step S1). Then, the transfer equipment 3 of the automatic guided vehicle 1 is opposed to the cassette 23, and the wafers 10, 10 . . . are stored in this cassette 23 by facing the surface with the ID mark 11 down.

Here, the mapping sensor 35 installed in the transfer hand 31 has access to the highest shelf position of the buffer cassette 5 by raising the base 38 and turning the turntable 39 and the transfer arm 30M on the master side. The transfer hand 31 moves to the lowest shelf position of the buffer cassette 5 in parallel by moving the base 38 downward in the state, and the mapping is implemented for detecting the presence of the wafers 10, 10 . . . in each shelf with photoelectric sensors 35a, 35a. Consequently, the detecting result is output to the vehicle controller 60, which can recognize what number of shelves does not store the wafers 10, 10 . . . (step S2). It also detects the displacement of the wafer at the same time, and the transfer is not implemented in case of the displacement.

The directions of the transfer arms 30M, 30S are inverted by rotating the turntable 39 by 180 degrees and the suction holes 34, 34 side of the transfer hand 31 is headed for the buffer cassette 5 (step S3).

If the mapping sensor 35 detects the vacancy in the shelf of the buffer cassette 5 (step S4), the wafer 10 in the cassette 23 placed in the stocker 22 is scooped by rotating and bending and stretching the transfer arm 30M after raising the base 38 and the wafer 10 is taken out of the cassette 23 by sucking with the air pump 64, absorbing and retaining with the suction holes 34, 34 of the transfer hand 31 and bending and stretching the transfer arm 30M in the state (step S5).

After the transfer hand 31 is inserted into the highest vacant shelf of the buffer cassette 5 and the both ends of the wafer 10 are placed in the shelf by raising the base 38 to the predetermined height and rotating and bending and stretching the transfer arm 30M with surely retaining the wafer 10 with the transfer hand 31, the storing process of the wafer 10 is completed by releasing the suction of the air pump 64, bending and stretching the transfer arm 30M and pulling the transfer hand 31 out below the wafer 10 (step S6).

Back to the step S4 here, the next wafer 10 is transferred in the same way if the vacancy still remains in the shelf of the buffer cassette 5.

Meanwhile, if it determines that there is no vacancy in the shelf of the buffer cassette 5 in the step S4, the position of the buffer cassette 5 is fixed by rotating in the above-mentioned lean state and the wafers 10, 10 . . . stored in the whole shelves with the stopper rod 55 are prevented from coming out (step S7). After that, the automatic guided vehicle 1 is traveled and moved to the processor 21 position (step S8).

The transfer equipment 3 in the automatic guided vehicle 1 is facing to a capture inlet 21a of the processor 21 then, and the wafer 10 in the highest step of the buffer cassette 5 is scooped by raising the base 38 and bending and stretching the transfer arm 30M on the master side and the wafer 10 is taken out of the buffer cassette 5 by sucking with the air pump 64, absorbing and retaining with the suction holes 34, 34 of the transfer hand 31 and bending and stretching the transfer arm 30M (step S9).

After that, the transfer hand 31 retaining the wafer 10 is turned to the positioning device 4 side by moving the base 38 down to the predetermined height, turning the turntable 39 by 180 degrees and reversing the directions of the transfer arms 30M, 30S (step S10). Next, after the wafer 10 is set on the place table 41 by bending and stretching the transfer arm 30M and inserting the transfer hand 31 to the positioning device 4, the suction of the air pump 64 is released and the transfer hand 31 is taken out below the wafer 10 by bending and stretching the transfer arm 30M (step S11).

The wafer 10 is placed on the place table 41 temporarily first like this and the place table 41 is turned by 360 degrees by sucking with the air pump 66 and absorbing and retaining the wafer 10 with the suction hole 44, so that the orientation flat 10a position (or the notch 10b position) of the wafer 10 and the rotation path drawn by the wafer 10 are detected by the orientation flat sensor 42 and the result is output to the vehicle controller 60 (step S12).

The ID mark 11 position marked in the predetermined position of the wafer 10 face is calculated by detecting the orientation flat 10a position (or notch 10b position) of this wafer 10, so that the positioning is implemented by rotating the place table 41 so as to bring the ID mark 11 position on the OCR 43.

The rotation path when the wafer 10 is set in a regular position of the place table 41 and rotated is input in the automatic guided vehicle controller 60 in advance, and the displacement of the rotation centers between the place table 41 and the wafer 10 is calculated by checking the rotation path of the temporarily placed wafer 10 which rotates by being eccentric against the regular rotation path. The modified value based on the calculation result is output from the vehicle controller 60 to the actuator 63 of the transfer arm 30M, so that the suction of the wafer 10 in the suction hole 44 is released and the wafer 10 is set on the place table 41 again with the transfer hand 31.

Consequently, the ID mark 11 position of the wafer 10 is precisely set on the OCR 43 position (step S13).

Additionally, the ways of setting the 12-inch wafer 10 and the 8-inch wafer 10 are different. The rotation center of the place table 41 is corresponded to the rotation center of the wafer 10 in case of the former 12-inch wafer 10, and the rotation center of the wafer 10 is set by displacing only the predetermined interval forward to the rotation center of the place table 41 and the ID mark 11 of the wafer 10 is arranged to be directly on the OCR 43 in case of the latter 8-inch wafer 10. This structure can make one OCR 43 read both the ID mark 11 of the 12-inch wafer 10 and the ID mark 11 of the 8-inch wafer 10, so that the cost can be reduced as there is no need to provide the OCRs 43, 43 by the size of the wafer 10 and the number of the relatively expensive OCRs 43, 43 for disposing can be reduced.

This OCR 43 reads the ID mark 11 marked on the face of the wafer 10 (step S14), and the ID information is transmitted from the communication device 68 of the automatic guided vehicle 1 to the communication device 16 of the central controller 15 and is output to the processor controller 70 of the processor 21 (step S15).

Thus, the ID information is input to the process means 72 before the wafer 10 marked this ID mark 11 is transferred to the processor 21.

As illustrated in FIG. 10, the place table 41 is rotated by sucking the wafer 10 with the air pump 66, and the orientation flat 10a position (or the notch 10b position) of the wafer 10 is turned to the predetermined direction based on the result by the orientation flat sensor 42 (step S16), so that the wafer 10 which is transferred to the processor 21 is transferred such that the orientation flat 10a position (or the notch 10b position) is always in the constant direction.

The wafer 10 on the place table 41 is scooped by bending and stretching the transfer arm 30M and the wafer 10 is taken out of the positioning device 4 by sucking with the air pump 64, absorbing and retaining with the suction holes 34, 34 of the transfer arm 31 and bending and stretching the transfer arm 30M (step S17).

Next, the transfer hand 31 retaining the wafer 10 is inserted into the capture inlet 21a of the processor 21 by rotating the turntable 39 counterclockwise by 90 degrees, moving the base 38 up and down to the predetermined height and bending and stretching the transfer arm 30M, seen from the top as illustrated in FIG. 3. Thus, the wafer 10 before the inspection process is set in the wafer loader of the capture inlet 21a and the transfer hand 31 is pulled out below the wafer 10 by bending and stretching the transfer arm 30M after releasing the suction of the air pump 64 (step S18).

If the wafer 10 is the wafer which is processed first (the first wafer 10) (step S19), the turntable 39 is rotated counterclockwise by 90 degrees by seen from the top and the same process as the one in the first wafer 10 is implemented by taking out the second wafer 10 from the buffer cassette 5 back to the step S9.

However, if the wafer 10 is not the first wafer 10 (step S19) or the wafer 10 is the over second wafer 10, the wafer 10 which is transferred to the processor 21 before the above wafer 10 is already inspected and waiting in a wafer unloader of the capture inlet 21a, and the wafer 10 retained with the transfer arm 30M on the master side is placed in the wafer loader of the processor 21 (step S18) and the inspected wafer 10 is taken out of the wafer unloader with the transfer arm 30S on the other slave side (step S20).

After the inspected wafer 10 is taken out of the processor 21 by being scooped with the transfer hand 31 of the transfer arm 30S, sucking and retaining with the suction holes 34, 34 with the air pump 64 and bending and stretching the transfer arm 30S, the turntable 39 is rotated counterclockwise by 90 degrees by seen from the top as illustrated in FIG. 3.

Here, the shelf that the wafer 10 retained with the transfer arm 30S on the slave side is originally stored (own space) and the shelf below it are vacant in the buffer cassette 5, and the inspected wafer 10 is stored in the buffer cassette 5 by releasing the suction with the air pump 64, bending and stretching the transfer arm 30S and pulling out the transfer hand 31 from below the wafer 10 after the transfer hand 31 of the transfer arm 30S is inserted into the shelf of own space and the both ends of the wafer 10 are placed on the shelf of own space (step S21).

Here, if the inspected wafer 10 stored in this buffer cassette 5 is not the wafer 10 which is processed last but one (the second last wafer 10) and originally stored in the second shelf from the bottom of the buffer cassette 5 (step S22), the transfer arm 30S on this slave side stores the inspected wafer 10 and the wafer 10 storing the second lower shelf from the shelf of my space stored in the inspected wafer 10 is scooped by the transfer arm 30M on the master side. The wafer 10 is taken out of the buffer cassette 5 by sucking and retaining with the suction holes 34, 34 with the air pump 64 and bending and stretching the transfer arm 30M in the state (step S23) and the same process is implemented back to the step S10.

The wafers 10, 10 . . . are processed like this, however, if the inspected wafer 10 stored in the buffer cassette 5 is the second last wafer 10 in the step S21, the turntable 39 is rotated clockwise by 90 degrees by seen from the top as illustrated in FIG. 3 and the transfer equipment 3 is waited till the inspection process of the last wafer 10 is completed and the last wafer 10 placed in the wafer unloader of the capture inlet 21a is taken out by the transfer arm 30S on the slave side (step S25).

Consequently, after the last wafer 10 is taken out of the processor 21 by scooping with the transfer hand 31 of the transfer arm 30S, sucking and retaining with the suction holes 34, 34 with the air pump 64 and bending and stretching the transfer arm 30S in the state, the turntable 39 is rotated counterclockwise by 90 degrees by seen from the top as illustrated in FIG. 3.

Only the lowest shelf of the buffer cassette 5 is vacant then, and after the transfer hand 31 of the transfer arm 30S retaining the last wafer 10 is inserted into the lowest shelf and the both ends of the last wafer 10 is placed on the lowest shelf, the last one wafer 10 is stored in the buffer cassette 5 by releasing the suction with the air pump 64, bending and stretching the transfer arm 30S and pulling out the transfer arm 31 from below the wafer 10 (step S26).

Consequently, the last one wafer 10 is stored in the lowest shelf of the buffer cassette 5 and a series of the process is completed.

Additionally, though the automatic guided vehicle 1 is stopped in front of the one processor 21 and the wafer 10 stored in the buffer cassette 5 is inspected by the same processor 21 in the preferred embodiment of the present invention, the different processor 21 can be used for the inspection. For example, when the central controller 15 receives the signal that the process is completed by the situation recognition means 71 of the processor 21, the carrier instruction created based on the information is transmitted from the communication device 16 to the vehicle controller 60 through the communication device 68. The vehicle controller 60 confirms whether or not the pre-inspection wafer 10 is stored in the buffer cassette 5 when receiving the carrying instruction and moves to the objective processor 21 according to the carrying instruction if the wafer 10 is stored in the buffer cassette 5. If the stored wafers 10 are all inspected, the automatic guided vehicle 1 comes back to the stocker 22 and the inspected wafer 10 of the buffer cassette 5 is transferred to the predetermined cassette 23 and the pre-inspection wafer 10 is transferred to the buffer cassette 5 by operating the transfer arm 30M, if necessary, operating both 30M, 30S and it is moved to the objective processor 21 for implementing the carrying instruction.

The automatic guided vehicle 1 arrives before the process of the processor 21 is completed in advance and prepares for transferring the wafer 10. In other words, for example, the pre-inspection wafer 10 of the buffer cassette 5 is transferred to the positioning device 4 with the transfer arm 30M, the wafer 10 is arranged to be in the predetermined position by operating the positioning device 4 and the ID information of the wafer 10 is recognized. More precisely, first, the wafer 10 is transferred from the buffer cassette 5 to the positioning device 4. In other words, the turntable 39 is rotated so as to head the transfer hand 31 of the transfer arm 30M for the buffer cassette 5 and the transfer arm 30M is extended. The wafer 10 is scooped up from the buffer cassette 5 by raising the elevating mechanism 61 and the wafer 10 is sucked to the transfer hand 31 by operating the air pump 64. After the transfer arm 30M is expanded and contracted to the predetermined position (the waiting position), the turntable 39 is rotated so as to head the transfer hand 31 to the positioning device 4 and the transfer arm 30M is extended. The wafer 10 is placed on the place table 41 of the positioning device 4 by moving the elevating mechanism 61 downward and stopping the air pump 64 and the transfer arm 30M is shortened to the predetermined position.

Next, the ID information of the wafer 10 is recognized. In other words, the place table 41 is rotated in the state of sucking and retaining the wafer 10 and the orientation flat sensors 42, 42 are operated. The orientation flat sensors 42, 42 recognize the direction of the wafer 10 from the peripheral rotation path of the wafer 10, the positional information is transmitted to the vehicle controller 60 and the position of the ID mark 11 is determined. The vehicle controller 60 moves the wafer 10 with the transfer arm 30M so as to meet the ID mark 11 directly above the OCR 43 based on the acquired positional information. The ID information of the ID mark 11 is read by operating the OCR 43 and memorized in the vehicle controller 60.

Next, the positioning is implemented for transferring the wafer 10 in the predetermined posture designated in the processor 21. In other words, the wafer 10 is transferred on the place table 41 again and the transfer arm 30M is shortened in the predetermined position. The vehicle controller 60 precisely recognizes the position of the orientation flat 10a (the notch 10b) by rotating the place table 41 and operating the orientation flat sensors 42, 42 again. The wafer 10 is transferred again so as to be in the predetermined posture in the predetermined position of the place table 41 by operating the transfer arm 30M based on the acquired positional information.

After that, it is waiting with retaining the wafer 10 in order to pass the wafer to the processor 21 immediately. In other words, the wafer 10 which becomes the predetermined posture is scooped up, sucked and retained by the transfer hand 31 and the transfer arm 30M is shortened to the predetermined position. The turntable 39 is rotated so as to head the transfer arm 30M for the processor 21.

Additionally, the positioning of the wafer 10 for the processor 21 is implemented by operating the orientation flat sensors 42, 42 again after the positioning of the ID mark 11 is implemented for the OCR 43 once by operating the orientation flat sensors 42, 42 and the ID mark 11 is recognized by moving it directly above the OCR 43 for convenience of the control of the transfer arm 30M (30S), however it is also available that the wafer 10 is placed precisely on the place table 41 with the transfer arm 30M (30S) for making the wafer 10 become the predetermined posture by operating the orientation flat sensors 42, 42, the wafer 10 is sucked and retained with the transfer hand 31 of the transfer arm 30M (30S), the ID mark 11 is read by the OCR 43 by moving the transfer arm 30M (30S) so as to meet the ID mark 11 of the wafer 10 directly above the OCR 43 and the turntable 39 is rotated by shortening the transfer arm 30M (30S) to the predetermined position.

Moreover, it is moved with the transfer arm 30M so as to meet the ID mark directly above the OCR 43 for reading the ID mark 11 of both the 8-inch wafer 10S and the 12-inch wafer 10L with the common OCR 43 according to the common operational procedure, however the ID mark 11 may be read with the OCR 43 by moving the 8-inch wafer 10S to the OCR 43 with the transfer arm 30M and by not moving the 12-inch wafer 10L specially as the OCR 43 is disposed so as to read the ID mark 11 if the wafer 10 is disposed in the predetermined position of the place table 41 in the predetermined posture.

The processor 21 confirms whether or not the transfer preparation is completed by communicating with the automatic guided vehicle 1 when the inspection process is completed. If it seems to be completed, the processor 21 transmits the ID information of the inspected wafer 10 to the automatic guided vehicle 1 and receives the ID information of the wafer 10 which is going to inspect next from the automatic guided vehicle 1. This information is also transmitted to the central controller 15.

The processor 21 opens the door provided in the capture inlet 21a. As the inspected wafer 10 is placed in the capture inlet 21a, the pre-inspection wafer 10 is placed by the transfer arm 30M after taking out the inspected wafer 10 with the transfer arm 30S. If the station of the wafer 10 provided in the capture inlet 21a is common and used for both the pre-inspection wafer and the inspected wafer, the inspected wafer 10 must be placed on the station after taking out the inspected wafer 10 first. If the stations for the pre-inspection wafer and the inspected wafer are separated, the inspected wafer 10 can be taken out in parallel to the placement of the pre-inspection wafer. The take-off and placement operations of the wafer 10 can be partly implemented in parallel even in the case that the stations are common.

The processor 21 closes the door of the capture inlet 21a when the placement of the wafer 10 is completed and the processor 21 can be inspected by evacuating air from the capture inlet 21a, for example.

The automatic guided vehicle 1 transfers the inspected wafer 10 to the place storing the wafer 10 transferred to such as the processor 21 of the buffer cassette 5.

The automatic guided vehicle 1 moves to the objective processor 21 when receiving new carrying instruction from the central controller 15. This carrying instruction is transmitted from the central controller 15 to the automatic guided vehicle 1 as needed. If a plurality of the carrying instructions is transmitted, the vehicle controller 60 schedules the moving order and the carrying instruction is implemented. This moving order is created according to the estimated time of completing the inspection of the respective processors 21 included in the carrying instruction and the order is according to the forwardness of the estimated time of completion. In addition, only one carrying instruction may be transmitted from the central controller 15 to the vehicle controller 60 of the automatic guided vehicle 1 at the point that the central controller 15 accumulates the carrying instruction, schedules the carrying instruction and the transfer process of the automatic guided vehicle 1 is completed.

When the automatic guided vehicle 1 is moved before completing the inspection of the processor 21 in advance, is read the ID information of the pre-inspection wafer 10 and is prepared and waited so as to transfer the wafer 10 to the processor 21 in the predetermined posture, the time for opening the door of the capture inlet 21a of the processor 21 can be reduced and the cleanliness in the capture inlet 21a is prevented from deteriorating as much as possible and the operating time of the processor 21 can be improved. A pair of the transfer arms 30M, 30S are provided in the automatic guided vehicle 1 in order to reduce the time for opening this door, and one transfer arm 30S (30M) takes out the inspected wafer 10 in the processor 21 and other transfer arm 30M (30S) places the pre-inspection wafer 10.

The buffer cassette 5 can store a plurality of the wafer 10 and a plurality of the processors 21 is provided along the traveling route of the automatic guided vehicle 1, so that the automatic guided vehicle 1 can be moved properly according to the process situation of the processors 21 and the time for giving the processor 21 a rest for the inspection can be shorten without providing the positioning means and the ID reading means in the respective processors 21.

In addition, the inspection processor is used as the processor 21 in the preferred embodiment of the present invention, the processor 21 is not confined to the inspection processor and the processor for such as the etching of the wafer 10 can be used.

Moreover, the processor 21 is provided in only one side of the traveling rails 20, 20 in the preferred embodiment of the present invention, however it can be provided on both sides across the traveling rails 20, 20. The turntable 39 is equipped with the automatic guided vehicle 1 and the wafer 10 can be transferred properly in the processor 21 provided on either side of the traveling rails 20, 20 by using this turntable 39.

Figure 11:
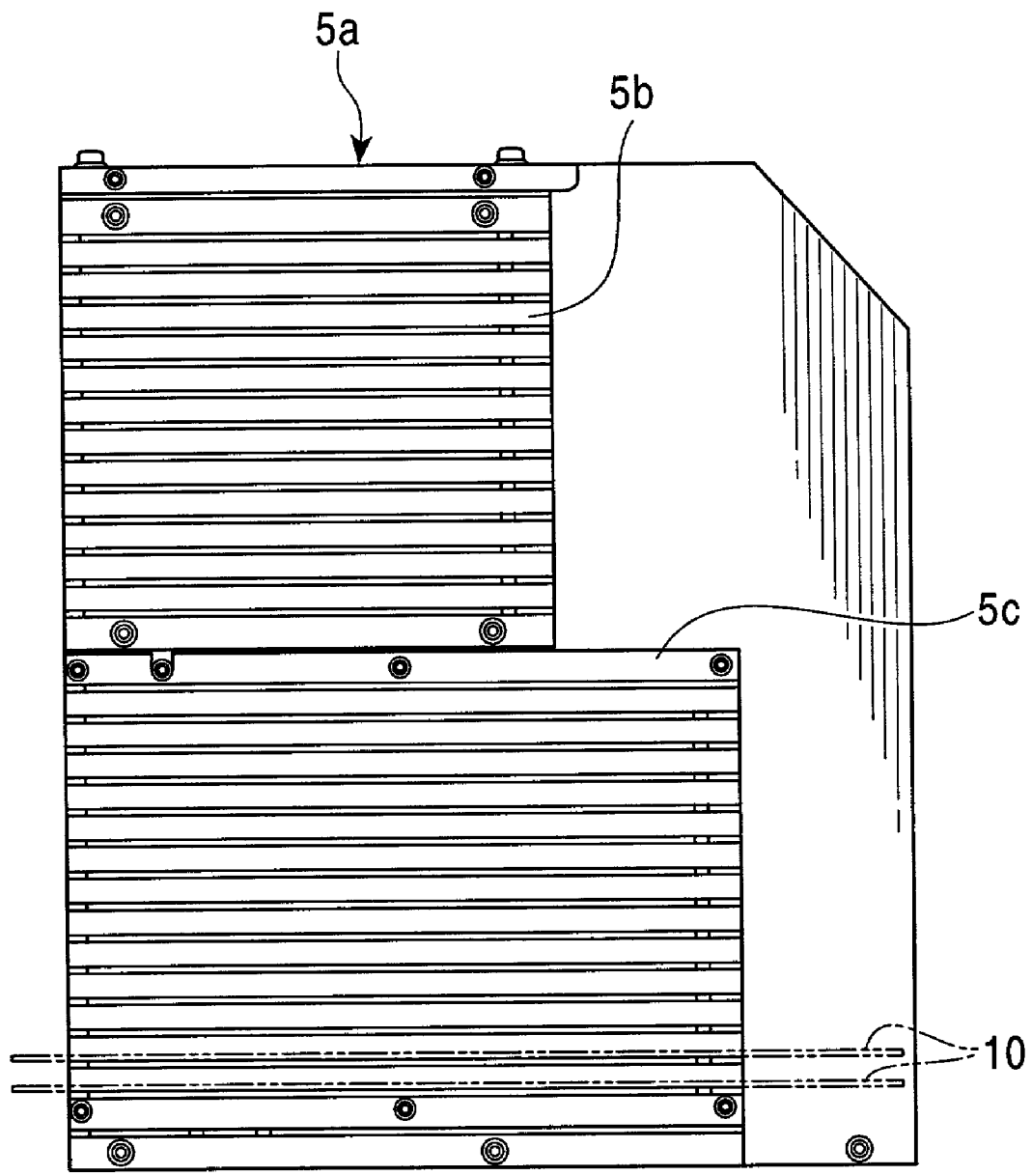
FIG. 11 is a side view illustrating an additional buffer cassette.

Moreover, the automatic guided vehicle 1 in the preferred embodiment of the present invention is prepared for both the 8-inch wafer 10 and the 12-inch wafer 10, however the buffer cassette 5a can store the both wafers 10 by making the upper part a shelf 5b for the 8-inch wafer 10 and the lower part a shelf for the 12-inch wafer 10 as illustrated in FIG. 11. It is effective in case that the processors 21 provided along the traveling rails 20, 20 are arranged side by side in a line for both 12-inch and 8-inch wafers 10, and the function of the automatic guided vehicle 1 for both 8-inch and 12-inch wafers 10 can be used to the full.

Due to the arrangement as described above, the present invention demonstrates the following advantages:

As in claim 1, the wafer can be transferred with the transfer means which moves to the almost horizontal direction by setting the cassette so as to take the wafer in and out in the horizontal state when transferring the wafer to the cassette with the transfer means and by setting the cassette so as not to jump out the wafer in the cassette when running the automatic guided vehicle, in the automatic guided vehicle equipped with the transfer means for loading the wafer and the fixed type cassette for storing the wafer temporarily.

Meanwhile, as the cassette is set so as not to come out the wafer in the cassette when traveling the automatic guided vehicle, the wafer in the cassette do not jump out when the automatic guided vehicle is stopped or accelerated suddenly etc. and the reliability can be improved.

Further, the wafer is stored in the cassette temporarily, so that the wafers can be carried effectively by storing a plurality of the wafers in the cassette at a time and the workability can be improved.

Moreover, the transfer means for transferring the cassette is made redundant and the number of parts can be reduced as the cassette is fixed in the automatic guided vehicle, so that the cost can be reduced.

Also, as in claim 2, the wafer in the cassette is prevented from jumping out by tilting the cassette on the automatic guided vehicle when carrying the automatic guided vehicle, so that the reliability can be improved.

As in claim 3, the wafer can be transferred with the transfer means which moves to the almost horizontal direction by fixing the position of the cassette in the state that the wafer in the cassette is horizontal or that the wafer in the cassette is leaned to the back side (the back face side) of the cassette by providing the rotating fulcrum on the near side of the back face of the cassette and making the cassette freely tilt, so that the transfer means can be composed in the relatively simple mechanism.

Moreover, the wafer in the cassette is prevented from jumping out by fixing the position of the cassette in the state that the wafer in the cassette is leaned to the backside (the back face side) of the cassette when traveling the automatic guided vehicle, so that the reliability can be improved.

Consequently, the mechanism of fixing the position of the cassette can be easily composed by the stopper etc. in the state that the wafer in the cassette is horizontal or leans to the backside of the cassette.

Additionally, as in claim 4, the automatic guided vehicle for carrying the semiconductor wafer automatically is equipped with the positioning means for truing up the position and direction of the wafer, the transfer means for transferring the wafer and the reading means for reading the wafer ID information, so that every processor does not need the positioning means, the wafer transfer means and the ID information reading means of the wafer and the cost can be reduced and the carrying system can be composed cheaply.

The wafer can be transferred in the precise position and direction by surely retaining the wafer as the retention means for preventing the displacement of the wafer is laid in the transfer means, so that the wafer can be transferred in the predetermined position and direction by heading the wafer ID information for the constant direction to the processor and the reliability can be improved.

Also, as in claim 5, the retention means becomes the suction means for activating the face of the wafer, so that the wafer is transferred in the precise position and direction by surely retaining the wafer and the reliability can be improved.

Moreover, as in claim 6, when the automatic guided vehicle carrying the semiconductor wafer automatically is equipped with the transfer means for transferring the wafer, the positioning means for truing up the position and direction of the wafer and the cassette for storing a plurality of wafers and the transfer means is disposed in the center of the automatic guided vehicle and the positioning device and the cassette are disposed in the vicinity of the transfer means, the distance between the positioning means and the transfer means is almost equal to the distance between the cassette and the transfer means, so that the control of the transfer means becomes easier and the transfer means can be smaller as the distance between the transfer means and the cassette or the positioning means becomes short, compared with the case that the transfer means is disposed in one end of the body of the automatic guided vehicle. This automatic guided vehicle equipped with the cassette can carry multiple wafers in one time and the carrying efficiency is better than the conventional automatic guided vehicle which carries the wafer one by one.

Further, as the automatic guide vehicle is equipped with the positioning means and the transfer means, the wafer is positioned with the positioning means so as to be the desired position to the processor on the automatic guided vehicle and the wafer can be placed in the desired position with the transfer means.

Consequently, the transfer means for taking out the wafer from the cassette is not needed for the whole processors and the cheaper carrying system can be composed. Also, the wafer can be prevented from displacing, which is happened by storing the wafer whose position is trued up once while carrying in the processor with displacing in the cassette.

Moreover, as in claim 7, the wafer is removed by one transfer means to the other device and another wafer can be transferred by the other transfer means as the wafer transfer means is composed by a pair of the transfer means, so that the time necessary for replacing the wafer can be reduced and the workability can be improved.

Also, as in claim 8, one transfer means can remove the wafer and the other transfer means can transfer another wafer to the other device by operating the one pair of the transfer means independently, so that the time necessary for replacing the wafer can be reduced and the workability can be improved.

Additionally, as in claim 9, multiple sizes of wafers are stored in the cassette, so that it is available even if a plurality of the other devices whose processible wafer sizes are different is arranged side by side in a line.

Furthermore, as in claim 10, regarding the system for transferring the wafer to the station by the automatic guided vehicle equipped with the transfer means for transferring the wafer, the cassette for storing the wafer fixed in the vehicle body, the positioning means for truing up the position and direction of the wafer and the reading means for reading the wafer ID information, the wafer ID information is read with the reading means and the wafer whose ID information is read with the transfer means in the state that the wafer in the cassette is transferred to the positioning means by taking it out with the transfer means and the position and direction of the wafer is trued up with the positioning means after the automatic guided vehicle which stores the wafer in the cassette with the transfer means is traveled to and stopped at the objective station, and if another wafer is placed on the station, another wafer is removed by the other transfer means and the wafer whose ID information is read is transferred to the station in the predetermined position and direction and the wafer transfer means provided on the conventional processor side is made redundant by providing the control means for controlling to transmit the ID information to the station, so that the cost can be reduced and the automatic guided vehicle system can be composed cheaply.

Moreover, as the wafer is transferred to the processor by cassette conventionally, a plurality of wafers has been inspected immediately by repeating such a process that each wafer is stored in different cassettes one by one in the station of the automated warehouse, the cassette is carried to the station of a plurality of the processors provided along the traveling route, the next cassette is received back to the warehouse and the wafer is carried to the next processor. However, the automatic guided vehicle system of the present invention is more effective and improves workability as a plurality of the wafers to inspect is stored in the cassette and the wafer is carried to the processor by parting sequentially by loading the cassette and the transfer means for transferring the wafer.

Furthermore, as in claim 11, when the station is installed in the processor of the wafer and the situation recognition means for recognizing the situation of the processor is provided in the station, the situation recognition means recognizes the present situation of the processor and it can be informed to the processor that the next wafer can be transferred before completing to process the wafer in the processor in advance, so that the process can be implemented smoothly and the workability can be improved.

Also, as in claim 12, one cassette can be corresponded even if a plurality of the processors whose processible wafer size is different is arranged side by side in a line by storing multiple sizes of wafers in the cassette.

In addition, as in claim 13, the station is disposed on the both sides of the traveling route in the automatic guided vehicle, so that the wafer can be carried to more processors and the workability can be improved.

Furthermore, as in claim 14, multiple sizes of the wafers are stored in the cassette, the station is installed in the processor of the wafer disposed on both sides of the traveling route of the automatic guided vehicle, the automatic guided vehicle controller for controlling the automatic guided vehicle is provided and the size of the wafer transferring the automatic guided vehicle and the transfer direction of the transfer equipment are recognized based on the information transmitted from the automatic guided vehicle, so that the desired size of wafer can be carried to the processor effectively according to the information from the automatic guided vehicle to more processor even if the size of the processible wafer is different by the processor.

Moreover, as in claim 15, regarding the wafer carrying method in the system that the wafer is carried to the station by the automatic guided vehicle loaded the transfer means for transferring the wafer, the cassette for storing the wafer which is fixed in the vehicle body, the positioning means for truing up the position and direction of the wafer and the reading means for reading the wafer ID information, the wafer ID information is read and the wafer whose ID information is read is retained with the transfer means in the state that the wafer in the cassette is transferred to the positioning means by picking it up with the transfer means and the position and direction of the wafer is trued up with the positioning means after the wafer is stored in the cassette with the transfer means and the automatic guided vehicle is stopped at the objective station, and if there is another wafer which is placed on the station, the wafer whose ID information is read is transferred to the station in the predetermined position and direction by removing with the other transfer means and the conventional wafer transfer means which is provided on the station side of the processor etc. is made redundant by transmitting the ID information to the station, so that the cost can be reduced and the automatic guided vehicle can be composed cheaply.

Moreover, if the inspection process of the wafer is implemented urgently etc., conventionally, the cassette is parted in each station and the inspection is implemented by that the cassette is loaded with the automatic guided vehicle which travels back and forth between the stations of the inspection processor and the automated warehouse, however the wafer stored in the cassette is parted by moving the automatic guided vehicle to each inspection processor in turn as the fixed type cassette is installed in the automatic guided vehicle, so that it is effective and the workability is improved.

The invention claimed is:

1. An automatic guided vehicle comprising:
   a transfer means for transferring a wafer between a station and a cassette;
   a stopper rod which presses the wafer to prevent the wafer from falling out of the cassette during running of the automatic guided vehicle;
   wherein the wafer can be horizontally moved into and out of the cassette, and
   wherein the stopper rod is positioned at a location that would not interfere with a transfer operation of the transfer means while the transfer means is used to transfer the wafer and is positioned at a location that would interfere with a transfer operation of the transfer means while the automatic guided vehicle is running.

2. An automatic guided vehicle as in claim 1,
   wherein the wafer in the cassette is prevented from falling out by tilting the cassette during the running of the automatic guided vehicle
   wherein the cassette is horizontally oriented when the transfer means is used to transfer the wafer, so as to allow the wafer to be horizontally moved in and out of the cassette.

3. An automatic guided vehicle as in claim 2, wherein the cassette is arranged to be tilted by providing a rotating fulcrum on a near side of a back face of the cassette and the position of the cassette is fixed in a state that the wafer in the cassette is horizontal or is leaned toward a back side of the cassette.

4. An automatic guided vehicle which automatically carries a semiconductor wafer between a cassette and a station, comprising:
   a means for preventing the wafer from falling out of the cassette by pressing the wafer,
   a positioning means for truing up the position and direction of the wafer,
   a transfer means for transferring the wafer,
   a reading means for reading the wafer ID information, and
   a retention means for preventing displacement of the wafer laid in the transfer means;
   wherein the positioning means and the reading means are activated while the vehicle is stopped, and
   wherein the means for preventing the water from falling out of the cassette is positioned at a location that would not interfere with a transfer operation of the transfer means while the transfer means is used to transfer the wafer and is positioned at a location that would interfere with a transfer operation of the transfer means while the automatic guided vehicle is running.

5. An automatic guided vehicle as in claim 4, wherein the retention means is a suction means interacting with the face of the wafer.

6. An automatic guided vehicle which automatically carries a semiconductor wafer between a cassette and a station, comprising:
   a vehicle body,
   a transfer means for transferring the wafer,
   a positioning means for truing up the position and direction of the wafer;
   wherein the transfer means is comprised of a pair of transfer arms and a turntable, and is always disposed entirely between the positioning means and the cassette.

7. An automatic guided vehicle as in claim 6, wherein each one of the transfer arms are independently operated.

8. An automatic guided vehicle as in claim 6, wherein the cassette stores multiple sizes of wafers.

9. An automatic guided vehicle system comprising:
   a station, and
   an automatic guided vehicle comprising:
   a first transfer arm for transferring a first wafer,
   a second transfer arm for transferring a second wafer,
   a cassette for storing both of the wafers which is fixed to the body of the vehicle,
   a positioning means for truing up the position and direction of both wafers, and
   a reading means for reading a wafer ID information;
   wherein the wafer ID information of the first wafer is read with a reading means,
   wherein the first wafer is transferred to the positioning means by taking it up with the first transfer arm,
   wherein the position and direction of the first wafer is trued up with the positioning means after the first wafer is stored in the cassette with the first transfer arm,
   wherein the automatic guided vehicle travels to and stops at the objective station, and removes the second wafer with the second transfer arm if the second wafer is present in the station,
   wherein the first wafer is transferred to the station in a predetermined position and direction, and
   wherein a control means is provided for transmitting ID information to the station.

10. An automatic guided vehicle system as in claim 9, wherein the station is installed in a processor of the wafers and a situation recognition means for recognizing the situation of the processor is provided in the station.

11. An automatic guided vehicle system as in claim 9, wherein the cassette stores multiple sizes of wafers.

12. An automatic guided vehicle system as in claim 9, wherein a plurality of stations are disposed on the both sides of a traveling route of the automatic guided vehicle.

13. An automatic guided vehicle as in claim 9,
    wherein the cassette stores multiple sizes of wafers,
    wherein the station is installed in the processor of the wafers disposed on both sides of the traveling route of the automatic guided vehicle,
    wherein an automatic guided vehicle controller for controlling an automatic guided vehicle is provided, and
    wherein the size of the wafers and the transfer direction are recognized based on information transmitted from the automatic guided vehicle controller.

14. A wafer carrying method comprising of the steps of:
    transferring a first wafer using a first transfer arm,
    storing the first wafer in a cassette which is affixed to a vehicle body, truing up the position and direction of the first wafer and reading a wafer ID information, wherein the wafer ID information of the first wafer is read with a reading means, wherein the first wafer is transferred to the positioning means by taking it up with the first transfer arm, wherein the position and direction of the first wafer is trued up with the positioning means after the first wafer is stored in the cassette with the first transfer arm, wherein the automatic guided vehicle travels to and stops at an objective station, and removes a second wafer with a second transfer arm if the second wafer is present in the station, wherein the first wafer is transferred to the station in a predetermined position and direction, and wherein the ID information is transmitted to the station.

* * * * *